United States Patent
Hirukawa

(10) Patent No.: US 7,713,889 B2
(45) Date of Patent: May 11, 2010

(54) SUBSTRATE PROCESSING METHOD, PHOTOMASK MANUFACTURING METHOD, PHOTOMASK, AND DEVICE MANUFACTURING METHOD

(75) Inventor: Shigeru Hirukawa, Tokyo (JP)

(73) Assignee: Nikon Corporation, Tokyo (JP)

( * ) Notice: Subject to any disclaimer, the term of this patent is extended or adjusted under 35 U.S.C. 154(b) by 175 days.

(21) Appl. No.: 11/600,151

(22) Filed: Nov. 16, 2006

(65) Prior Publication Data

US 2007/0134940 A1    Jun. 14, 2007

Related U.S. Application Data

(60) Provisional application No. 60/772,879, filed on Feb. 14, 2006.

(30) Foreign Application Priority Data

Nov. 16, 2005    (JP) ............................. 2005-332236

(51) Int. Cl.
*H01L 21/00*    (2006.01)
(52) U.S. Cl. .................................... 438/800
(58) Field of Classification Search ................ None
See application file for complete search history.

(56) References Cited

U.S. PATENT DOCUMENTS

| 5,546,225 | A | 8/1996 | Shiraishi |
| 6,775,815 | B2 | 8/2004 | Ki et al. |
| 7,073,924 | B2 | 7/2006 | Koizumi et al. |
| 2001/0026448 | A1 | 10/2001 | Koizumi et al. |
| 2003/0106999 | A1* | 6/2003 | Komuro et al. ............. 250/307 |
| 2003/0147059 | A1 | 8/2003 | Tokuda et al. |
| 2004/0106293 | A1 | 6/2004 | Igarashi |
| 2005/0170264 | A1 | 8/2005 | Hukuhara |
| 2005/0233601 | A1* | 10/2005 | Tsuchiya et al. ............ 438/800 |

FOREIGN PATENT DOCUMENTS

| JP | A 2001-230323 | 8/2001 |
| JP | A 2001-284222 | 10/2001 |
| JP | A 2002-270586 | 9/2002 |
| JP | A 2003-107665 | 4/2003 |
| JP | A 2004-85612 | 3/2004 |
| JP | A 2005-203637 | 7/2005 |
| JP | A 2005-303088 | 10/2005 |

* cited by examiner

*Primary Examiner*—Charles D Garber
*Assistant Examiner*—Andre' C Stevenson
(74) *Attorney, Agent, or Firm*—Oliff & Berridge, PLC

(57) ABSTRACT

A device linewidth characteristic is predicted based on a sharp-edged feature of a projected image of a predetermined pattern (steps 104 to 110), and an exposure condition of the pattern is adjusted based on the device linewidth characteristic that has been predicted (step 112). Then, exposure is performed under the adjusted exposure condition. That is, patterning of a resist on a substrate is performed with the projected image of the pattern (step 114). And, by developing the substrate after patterning, a resist pattern that satisfies a desired device linewidth characteristic is formed on the substrate. Accordingly, by performing etching of the substrate with the resist pattern serving as a mask, a pattern after etching can be formed with a desired linewidth.

29 Claims, 6 Drawing Sheets

Narrower Space

*Fig. 6A*           *Fig. 6B*
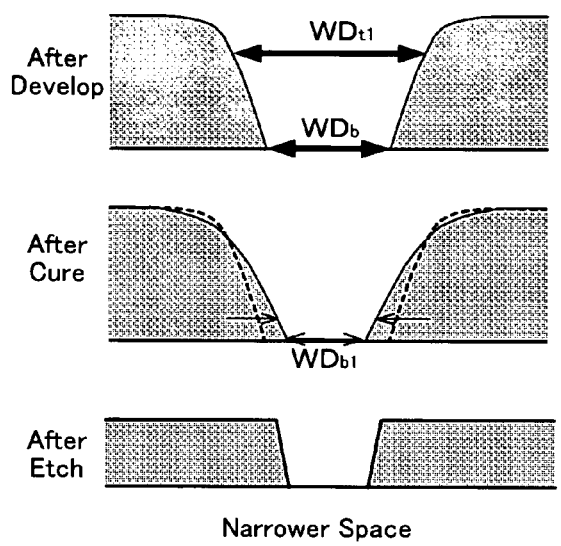
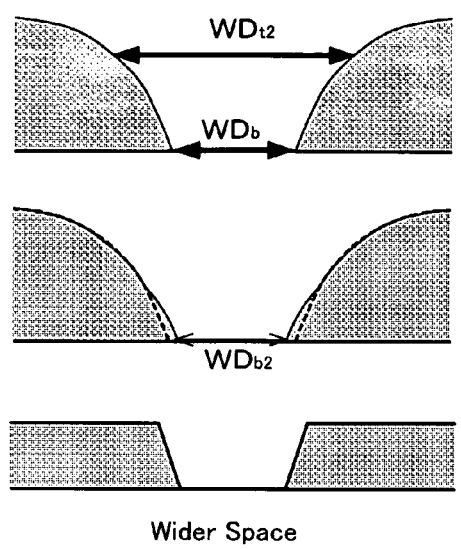
Narrower Space          Wider Space
*Fig. 7A*          *Fig. 7B*
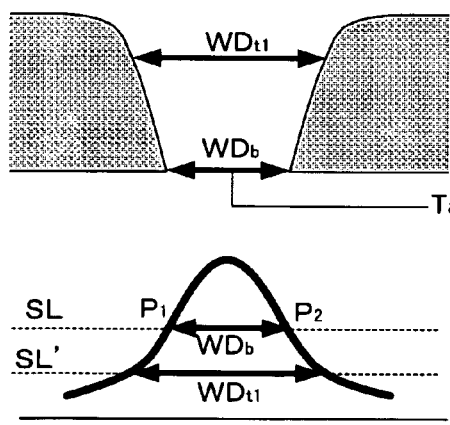
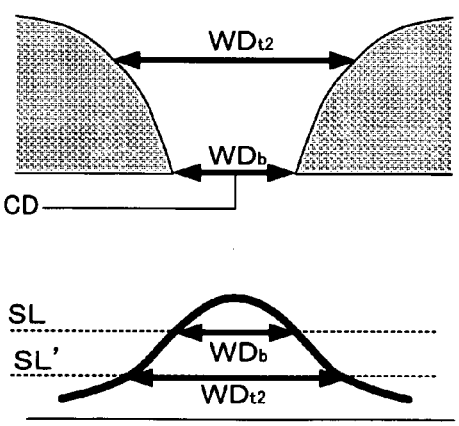

SUBSTRATE PROCESSING METHOD, PHOTOMASK MANUFACTURING METHOD, PHOTOMASK, AND DEVICE MANUFACTURING METHOD

CROSS-REFERENCE TO RELATED APPLICATIONS

This non-provisional application claims the benefit of Provisional Application No. 60/772,879 filed Feb. 14, 2006, the disclosure of which is hereby incorporated herein by reference in its entirety.

BACKGROUND OF THE INVENTION

1. Field of the Invention

The present invention relates to substrate processing methods, manufacturing method of photomasks, photomasks, and device manufacturing methods, and more particularly to a substrate processing method that includes a patterning step in which patterning of a resist on a substrate is performed by exposure for manufacturing electronic devices (microdevices) such as a semiconductor, a manufacturing method of a photomask used in the patterning step, a photomask manufactured by the manufacturing method, and a device manufacturing method that uses the substrate processing method or the photomask.

2. Description of the Background Art

When manufacturing electronic devices, in the substrate processing step or the wiring step in a wafer processing step (pre-process), a series of processing such as a patterning step (i.e. exposure step) in which patterning of a resist layer formed on a wafer is performed by exposure, a development step in which the wafer that has been patterned is developed, an etching step in which the wafer (or a film on the wafer) is etched (mainly dry etching) with the resist pattern (resist image) that has been developed serving as a mask and the like is repeatedly performed.

However, recently, it was discovered that in some cases the size of the pattern formed after etching differs from the size of the pattern in target after etching even if the resist image of the same size as the target is formed by patterning. It turned out that especially in the case when an isolated pattern and a dense pattern that are supposed to have the same resist image linewidth are formed on the same photomask, the tendency was high of the linewidth after etching varying per each pattern. In the case an isolated pattern and a dense pattern are formed on the same photomask, the linewidth of each of the patterns on the photomask is normally set taking into consideration the optical proximity effect.

As an example of using a space pattern, the wiring step will be described. In the wiring step, as the wiring material, aluminum (Al) has been conventionally used. In recent years, however, copper (Cu), which has a lower electric resistance than aluminum and is suitable for finer patterning and high-speed operations, has become to be used. However, with copper, a technique referred to as the damascene method is employed as the technique for forming wiring without etching the copper (refer to, for example, Kokai (Japanese Patent Unexamined Application Publication) No. 2002-270586), taking into consideration the fact that etching rate control is difficult when compared with aluminum. In the copper wiring by the damascene method, wiring is formed by depositing copper by plating or the like after forming a groove in an interlayer insulating film, and removing the copper on the surface by CMP (Chemical Mechanical Polishing).

When a space pattern is used as the pattern of the photomask as in the case when the damascene method is employed, it has recently been discovered that even if a resist image of the same size as the target size is formed by patterning, the tendency was high of the size of the pattern formed after etching being different from the pattern size in target after etching.

Meanwhile, in electronic devices such as a semiconductor device, due to the progress in finer geometry, higher precision in processing size is required at a nanometer level. Because unevenness or variation in the finished dimension of devices particularly affects the yield or the operation speed of the device, requirements to reduce unevenness and variation are pressing.

According to such a background, expectations were high for a technology that allows the pattern size after etching to be set for certain at a desired value.

In order to investigate the cause of the phenomenon in which the pattern linewidth after etching differs from the pattern linewidth in target, the inventor performed various experiments (including simulation). As a consequence, the inventor reached an assumption that the main cause for the relation between the linewidth of the resist image after development and the linewidth of the pattern after etching varying was due to the profile of the resist image differing, for example, depending on exposure conditions of the pattern or the like.

Further details on this point will be described, using a space pattern as an example. In the space patterns after development illustrated in the upper section of FIGS. 6A and 6B, the resist images both have the same linewidth (the linewidth at the bottom of the resist image) $WD_b$, however, between linewidths $WDt_1$ and $WDt_2$ close to the top of the resist images, a relation $WDt_1 < WDt_2$ exists, which shows an obvious difference in the resist profiles of the space patterns. Because of such difference in the profiles, deformation condition of the resist image profiles after cure (heat treatment) illustrated in the middle section of FIGS. 6A and 6B greatly differs. More specifically, the resist image in FIG. 6A that has a good profile greatly collapses (deforms) due to the heating (other than heat treatment using heaters or the like, heat treatment by ultraviolet light irradiation or the like is also included) in the cure process when compared with the resist image in FIG. 6B that has a bad profile. As a consequence, in the resist image after cure, the linewidth of the resist image is narrower in FIG. 6A than in FIG. 6B ($WD_{b1} < WD_{b2}$). Accordingly, the linewidth of the space patterns after etching illustrated in the lower section of FIGS. 6A and 6B, FIG. 6A is narrower in FIG. 6A when compared with FIG. 6B.

In order to obtain a resist image of the same linewidth in an isolated space pattern and a dense space pattern, the linewidth of the isolated space pattern on the photomask is set wider than the linewidth of the dense space pattern, taking into consideration the optical proximity effect. Accordingly, in the case exposure is performed under the same exposure conditions, the linewidth of the resist image of the isolated space pattern and the resist image of the dense space pattern is substantially the same, however, the profiles of the resist images usually differ, and as a consequence, the linewidth after etching varies in each space pattern.

On further investigation, the inventor consequently found out that there was a close relation between the resist image profile and the projected image (the aerial image) of the pattern. More specifically, in the upper half of FIGS. 7A and 7B, a resist image of a space pattern that has a good profile and a resist image of a space pattern that has a bad profile are illustrated. Further, in the lower half of FIGS. 7A and 7B, aerial images (projected images) of the pattern corresponding to each of the resist images in the upper half are illustrated. As is obvious from FIGS. 7A and 7B, in both cases when the profile of the resist image is good and when the resist image profile is bad, the target linewidth (Target CD) of the resist image of the space pattern is set by linewidth $WD_b$ at the bottom of the resist image, and the bottom linewidth $WD_b$ coincides with the distance $WD_b$ (hereinafter referred to as "projected image linewidth") between two intersecting points of the projected image of the corresponding pattern and a predetermined slice level SL. Further, linewidths $WD_{t1}$ and $WD_{t2}$ ($>WD_{t1}$) in the vicinity of the top of each of the resist images coincide with a slice levels SL', which is a slice level that is lower by a predetermined value than the above-mentioned predetermined slice level SL of the projected image of the corresponding pattern.

Further, as is obvious when comparing FIGS. 7A and 7B, the change in the projected image linewidth with respect to the change in the slice level is smaller in the sharp-edged projected image shown in FIG. 7A (corresponding to the resist image that has a good profile) than the rounded-edged projected image shown in FIG. 7B (corresponding to the resist image that has a bad profile).

From the description above, the inventor reached a conclusion that there was a close relation between the sharp-edged feature of the projected image of the pattern and the profile of the resist image, or as a consequence, the device linewidth characteristics that has a close relation with the profile (related to the linewidth of the pattern after cure (or etching)).

SUMMARY OF THE INVENTION

The present invention was made under the above new findings that the inventor obtained, and according to a first aspect of the present invention, there is provided a substrate processing method that comprises a patterning process of a resist on a substrate by exposure, the method comprising: a process of predicting a device linewidth characteristic based on a sharp-edged feature of a projected image of a predetermined pattern; and a process of adjusting an exposure condition of the pattern based on the device linewidth characteristic that has been predicted.

According to this method, the device linewidth characteristic is predicted based on the sharp-edged feature of the projected image of the predetermined pattern, and based on the device linewidth characteristic that has been predicted, the exposure condition of the pattern is adjusted. Accordingly, by performing exposure under the adjusted exposure condition, or in other words, by performing patterning of the resist coated on the substrate (or on the thin film on the substrate) with the projected image of the pattern and developing the substrate after the patterning, a resist pattern that satisfies the desired device linewidth characteristic is formed on the substrate (or on the thin film on the substrate). In the manner described above, it becomes possible to form a pattern of a desired linewidth on the substrate.

According to the substrate processing method in the present invention, when an isolated pattern and a dense pattern are transferred onto a resist in one exposure in the patterning step, the exposure condition is adjusted to make a line width of a resist pattern and a linewidth of a pattern after etching be in a desired relation in both the isolated pattern and the dense pattern. In this case, especially when the pattern is an isolated space pattern and a dense space pattern, the illumination condition of the patterns can serve as the exposure condition.

According to a second aspect of the present invention, there is provided a first device manufacturing method that comprises a lithography step in which a pattern is formed on a substrate using a substrate processing method of the present invention.

According to this method, in the substrate processing step, because the pattern is formed on the substrate using the substrate processing method of the present invention, a pattern of a desired linewidth can be formed on the substrate, which can suppress the generation of unevenness and variation in the finished size of the device, and a device with a good operation speed can be manufactured with good yield.

In this case, the lithography step can comprise a substrate processing step in which at least one of a wiring pattern and a gate pattern of a transistor is formed.

In this case, the wiring pattern and the gate pattern of the transistor can be a groove pattern. In such a case, the groove after etching that corresponds to the resist pattern of the same linewidth is a groove of the same linewidth.

According to a third aspect of the present invention, there is provided a manufacturing method of a photomask used in a patterning process of a resist on a substrate by exposure, the method comprising: a process of predicting a device linewidth characteristic based on a sharp-edged feature of a projected image of a pattern that is to be formed on the photomask; and a process of changing a linewidth in at least a part of the pattern based on the device linewidth characteristic that has been predicted and forming a pattern whose linewidth in at least a part of the pattern has been changed on a mask substrate.

According to this method, the device linewidth characteristic is predicted based on the sharp-edged feature of the projected image of the pattern that is to be formed on the photomask, and the linewidth is changed in at least a part of the pattern based on the device linewidth characteristic that has been predicted, and the pattern whose linewidth in a part of the pattern has been changed is formed on the mask substrate. Accordingly, by performing exposure using the photomask manufactured in the manner described above, or in other words, by performing patterning of the resist coated on the substrate (or on the thin film on the substrate) with the projected image of the pattern and developing the substrate after the patterning, a resist pattern that satisfies the desired device linewidth characteristic is formed on the substrate (or on the thin film on the substrate). In the manner described above, it becomes possible to form a pattern of a desired linewidth on the substrate.

According to a fourth aspect of the present invention, there is provided a photomask used in a patterning process of a resist on a substrate by exposure, on which a pattern is formed using the manufacturing method of a photomask in the present invention.

According to the photomask, by performing exposure using the photomask, or in other words, by performing patterning of the resist coated on the substrate (or on the thin film on the substrate) with the projected image of the pattern and developing the substrate after the patterning, a resist pattern that satisfies the desired device linewidth characteristic is formed on the substrate (or on the thin film on the substrate). In the manner described above, it becomes possible to form a pattern of a desired linewidth on the substrate.

According to a fifth aspect of the present invention, there is provided a second device manufacturing method that comprises a lithography step in which a pattern is formed on a substrate using a photomask of the present invention.

BRIEF DESCRIPTION OF THE DRAWINGS

In the accompanying drawings;

FIGS. 6A and 6B are views that show an alternation of a linewidth of a resist image, a linewidth of a resist image after cure, and a linewidth of a space pattern after etching in the case when a profile of the resist image is good and when a profile of the resist image is bad: and FIGS. 7A and 7B are views that show a resist image of a space pattern with a good profile and a resist image of a space pattern with a bad profile, and the corresponding aerial images (projected images) of the patterns.

DESCRIPTION OF THE EMBODIMENTS

Figure 1:
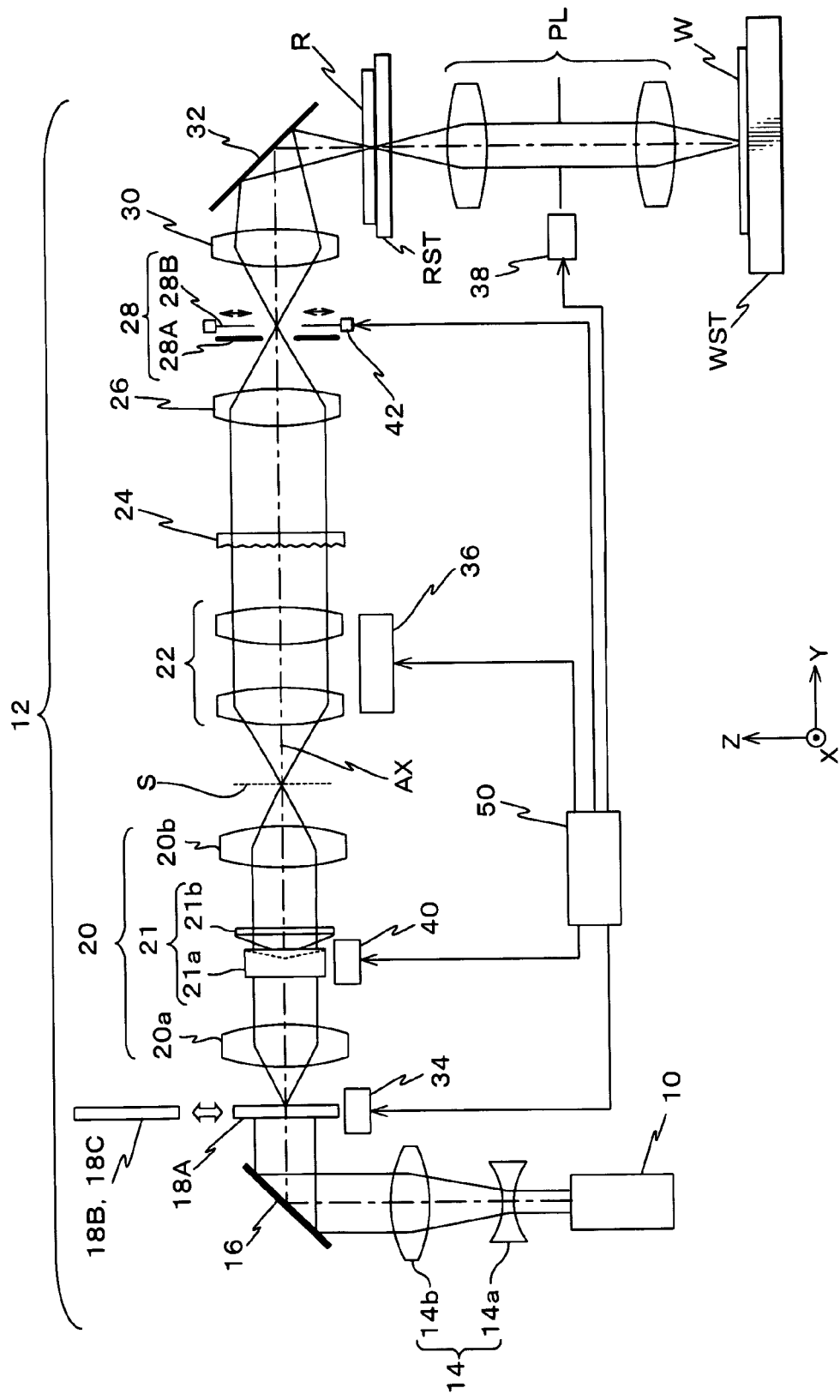
FIG. 1 is a view that shows a schematic configuration of an exposure apparatus related to a first embodiment.

Hereinafter, a first embodiment of the present invention will be described, based on FIGS. 1 to 7B. FIG. 1 shows an entire view of an arrangement of an exposure apparatus 100 related to the first embodiment. Exposure apparatus 100 is a scanning exposure apparatus based on a step-and-scan method, that is, the so-called scanning stepper (also called a scanner). In FIG. 1, a Z-axis is set parallel to a single optical axis AX of a projection optical system PL, a Y-axis is set in a direction parallel to the page surface of FIG. 1 within a plane orthogonal to the Z-axis, and an X-axis is set in a direction perpendicular to the page surface of FIG. 1. In FIG. 1, an illumination optical system 12 which will be described later is set to perform an annular illumination.

The exposure apparatus in FIG. 1 is provided with an illumination system that includes a light source 10 and illumination optical system 12, a reticle stage RST on which a reticle (photomask) R is mounted, projection optical system PL, a wafer stage WST on which a wafer W is mounted, a control system 50 that has overall control over the entire apparatus, and the like.

As light source 10, an excimer laser light source is used that oscillates, for example, a KrF excimer laser beam that has wavelength of 248 nm or an ArF excimer laser beam that has wavelength of 193 nm. Illumination optical system 12 includes a beam expander 14, a bending mirror 16, a diffractive optical element (DOE) 18 (18A to 18C), an a focal lens (a relay optical system) 20, a zoom lens (a variable power optical system) 22, an optical integrator (in the embodiment, a micro fly-eye lens (a microlens array) is used, which will also be referred to as micro fly-eye in the description below) 24, a condenser optical system 26, a reticle blind 28 serving as an illumination field stop, and image-forming optical system 30, a bending mirror 32, and the like.

The substantially parallel beams emitted from light source 10 (exposure light (illumination light)) have a rectangular cross-section narrowly extending along the X-axis direction, and enter beam expander 14 serving as a beam shaping optical system that consists of a pair of lenses 14a and 14b. Lenses 14a and 14 have a negative refracting power and a positive refracting power, respectively, in the page surface of FIG. 1 (within a YZ plane). Accordingly, the beams that enter beam expander 14 are enlarged within the page surface of FIG. 1, and are shaped into beams that have the predetermined rectangular cross-section.

The beams outgoing beam expander 14 enters diffractive optical element (DOE) 18A via bending mirror 16. In the case the parallel beams having the rectangular cross-section enter diffractive optical element 18A, cross-section enter diffractive optical element 18A has a function of forming an annular light intensity distribution in the far field (Fraunhofer diffraction region). That is, the beams that enter diffractive optical element 18A are diffracted equiangularly in the entire circumferential direction with optical AX serving as the center and become annular beams.

Diffractive optical element 18A is arranged freely insertable into and withdrawable from the illumination optical path, and is switchable with diffractive optical element 18B for quadrupole illumination and diffractive optical element 18C for normal illumination. More specifically, diffractive optical element 18A is supported on a turret board (rotary plate: not shown) that can rotate around a predetermined axis parallel to optical axis AX. On the turret board, a plurality of diffractive optical elements 18A with different characteristics used for annular illumination, a plurality of diffractive optical elements 18B with different characteristics used for quadrupole illumination, and a plurality of diffractive optical elements 18C with different characteristics used for normal illumination are arranged along a circumferential direction. Accordingly, by rotating the turret board, a desired diffractive optical element selected from a number of diffractive optical elements 18A to 18C can be positioned in the illumination optical path. The rotation of the turret board (and consequently the changing (switching) of the diffractive optical element) is performed by a first drive system 34, which operates under the command of control system 50. The switching mechanism between the diffractive optical elements is not limited to the turret method, and the mechanism, for example, can employ a slide method. Further, diffractive optical elements different from the above diffractive optical elements 18A to 18C, such as diffractive optical elements used for multipole illumination besides quadrupole illumination as in dipole or tripole illumination, can also be used. The configuration and the function of diffractive optical element 18B used for quadrupole illumination and diffractive optical element 18C used for normal illumination will be described later in the description.

The beams outgoing from diffractive optical element 18A enter afocal lens (relay optical system) 20. Afocal lens 20 is an afocal system (afocal optical system), which is set so that the front side focal position substantially coincides with the position of diffractive optical element 18A and the rear side focal position also substantially coincides with the position of a predetermined surface S indicated by the dotted line in the drawing.

Accordingly, after the beams outgoing from diffractive optical element 18A form an annular light intensity distribution on the pupil plane of afocal lens 20, the beams exit from afocal lens 20 as substantially parallel beams. In the optical path between a front side lens group 20a and a rear side lens group 20b, a conic axicon 21 is placed whose configuration and function will be described later in the description. The beams that exit afocal lens 20 enter micro fly-eye 24 via zoom lens (variable power optical system) 22.

In the embodiment, diffractive optical element 18, conic axicon 21, and zoom lens 22 constitute a shaping optical system that can optionally set the illumination conditions of reticle R by changing the intensity distribution of the illumination light on the pupil plane of illumination optical system 12 (that is, the size and shape of the secondary light source). Further, although it is omitted in FIG. 1, an optical unit that includes a phase shifter (e.g. a half-wave plate, a quarter-wave plate, an optical rotator, and the like) or a plurality of wedge-shaped prisms disclosed in the pamphlet of International Publication WO2005/036619 and the like, and can optionally set the polarization state of the illumination light, which is one of the illumination conditions, is arranged as a part of, or separately with the shaping optical system.

Micro fly-eye 24 is an optical element consisting of a number of minute lenses that have a positive refracting power of a predetermined shape disposed densely in a matrix. In general, a micro fly-eye is made by forming a group of minute lenses, for example, by applying etching treatment to a plane parallel glass plate.

Each minute lens in the micro fly-eye is smaller than each lens element in a normal fly-eye lens. Further, the micro fly-eye is formed integrally without the number of minute lenses being separated from one another, different from the fly-eye lens consisting of lens elements that are completely separated from one another. However, the point where lens elements with a positive refracting power are disposed in a matrix in the micro fly-eye is the same as the fly-eye lens. In FIG. 1, for the sake of clarity, the number of minute lenses in micro fly-eye 24 is shown much fewer than the actual number.

Accordingly, the beams that enter micro fly-eye 24 are divided two-dimensionally by the number of minute lenses, and on the rear side focal plane of each minute lens (substantially coincides with the pupil plane of the illumination optical system), an annular light source (that is, a surface light source (a secondary light source) consisting of multiple light source images) is formed.

The position of predetermined surface S substantially coincides with the front side focal position of zoom lens 22, and the incident plane of micro fly-eye 24 is disposed in the vicinity of the rear side focal position of zoom lens 22. In other words, zoom lens 22 substantially puts predetermined surface S and the incident plane of micro fly-eye 24 in a Fourier transform relationship, and consequently puts the pupil plane of afocal lens 20 and the incident plane of micro fly-eye 24 in a relation substantially conjugate optically. Accordingly, on the incident plane of micro fly-eye 24, for example, an annular illumination field centering on optical axis AX is formed as in the case on the pupil plane of afocal lens 20. The entire shape of the annular illumination field alters similarly depending on the focal length of zoom lens 22. The focal length of zoom lens 22 is changed by a second drive system 36 that operates under the command of control system 50. Further, in the embodiment, each minute lens of micro fly-eye 24 has a rectangular cross-section similar to the shape of an illumination field (illumination area) that should be formed on reticle R (consequently the shape of an exposure area that should be formed on wafer W).

The beams from the annular secondary light source formed on the rear side focal plane of micro fly-eye 24 enter reticle blind 28 via condenser optical system 26. Reticle blind 28 in the embodiment sets the illumination area that the illumination light irradiates on reticle R in a slit shape that narrowly extends in the X-axis direction, and includes a fixed reticle blind 28A that sets the width of the illumination area in at least the Y-axis direction and a movable reticle blind 28B disposed on a plane conjugate to the pattern surface of reticle R. Movable reticle blind 28B can change the width of the illumination area in both the X-axis and the Y-axis directions. Movable reticle blind 28B is driven by a blind drive system 42 that operates under instructions of control system 50. And, by driving movable reticle blind 28B at the beginning and the end of scanning exposure so as to further limit the illumination area, exposure of unnecessary areas can be prevented.

The beams that pass through reticle blind 28 are irradiated on reticle R, via image-forming optical system 30 and bending mirror 32. The beams that have passed through reticle R form an image of the reticle pattern on wafer W via projection optical system PL. And, by performing scanning exposure in which the movement of reticle R with respect to the illumination area and the movement of wafer W with respect to the exposure area (a projection area of a pattern image substantially conjugate to the illumination area related to projection optical system PL) in the Y-axis direction are synchronously controlled for each shot area on wafer W, the pattern of reticle R is transferred onto each shot area on wafer W by the step-and-scan method.

As projection optical system PL, for example, a reduction optical system that is a both-side telecentric refracting system with a projection magnification of, e.g. ¼ times, is used. On the incident pupil plane of projection optical system PL, a variable aperture stop is arranged for setting the numerical aperture of projection optical system PL. This variable aperture stop is driven by a third drive system 38 that operates under the command of control system 50.

Exposure apparatus 100 of the embodiment furthermore is provided with an aerial image measuring instrument (not shown) by the slit-scan method that has at least a part of the instrument installed inside wafer stage WST. As the aerial image measuring instrument, a unit that has a configuration similar to the ones disclosed in, for example, Kokai (Japanese Unexamined Patent Application Publication) No. 2002-198303, and the corresponding U.S. Patent Application Publication No. 2002/0041377 is employed.

Now, conic axicon 21 will be described. Conic axicon 21 includes a first prism member 21a that has a planar incident surface and an outgoing surface, which is a concaved conical refracting surface, and a second prism member 21b that has an incident surface, which is a convexed conical refracting surface, and a planar outgoing surface. And, the concaved conical refracting surface of the first prism member 21a and the convexed conical refracting surface of the second prism member 21b are formed complementarily, so that the surfaces can come into contact.

Further, at least one of the first prism member 21a and the second prism member 21b is configured movable along optical axis AX, and the distance between the concaved conical refracting surface of the first prism member 21a and the convexed conical refracting surface of the second prism member 21b is variable. The distance change of conic axicon 21 is performed by a fourth drive system 40 that operates under the command of control system 50.

More specifically, in the embodiment, when the annular secondary light source set by diffractive optical element 18A increases the distance of conic axicon 21, for example, from zero to a predetermined value, then the annular secondary light source alters to an annular secondary light source whose outer diameter and inner diameter are enlarged, without the width (e.g. ½ of the difference between the outer and inner diameters) substantially changing. In other words, by the operation of conic axicon 21, the annular ratio (the ratio of the outer and inner diameters) and the size (outer diameter) of the annular secondary light source change, without any change in the width.

Further, in the embodiment, when the annular secondary light source increases the focal length of zoom lens 22, for example, from a minimum value to a predetermined value, then the annular secondary light source alters to an annular secondary light source whose entire shape is similarly enlarged. In other words, by the operation of zoom lens 22, the width and the size (outer diameter) of the annular secondary light source change, without any change in the annular ratio.

As is described above, in the embodiment, by at least one of conic axicon 21, zoom lens 22, and the variable aperture stop of projection optical system PL, coherence factor (a value: the ratio of the numerical aperture of the beams from the secondary light source with respect to the numerical aperture on the reticle side of projection optical system PL, hereinafter also referred to as illumination σ), which is one of the illumination conditions, can be made continuously variable.

In this case, due to restrictions in optical design, there is actually a limit in the variation range of the annular ratio by conic axicon 21. Therefore, in the embodiment, as diffractive optical element 18A for annular illumination, a plurality of diffractive optical elements, e.g. two, with different characteristics are provided. More specifically, one of the diffractive optical elements for annular illumination forms an annular secondary light source suitable when the annular ratio varies in the range of, for example, 0.4 to 0.6. Further, the other diffractive optical element for annular illumination forms an annular secondary light source suitable when the annular ratio varies in the range of, for example, 0.6 to 0.8. As a consequence, with conic axicon 21 and the two diffractive optical elements for annular illumination, it becomes possible to change the annular ratio in the range of 0.4 to 0.8.

As is described earlier, diffractive optical element 18A is configured freely insertable into and withdrawable from the illumination optical path, and is configured switchable with other diffractive optical elements, such as diffractive optical element 18B for quadrupole illumination or diffractive optical element 18C for normal illumination. Accordingly, by setting diffractive optical elements 18B and 18C each on the illumination optical path, illumination conditions for quadrupole illumination, normal illumination and the like can be set. For example, in the case of quadrupole illumination, similar to the case of annular illumination described above, the annular ratio (the ratio of the diameter of a circumscribed circle of the four light sources and the diameter of an inscribed circle of the four light sources) of the illumination light on the pupil plane of the illumination optical system is variable by conic axicon 21, and the size of the illumination light (each light source) on the pupil plane of the illumination optical system is variable by zoom lens 22. Further, the σ value is also variable by conic axicon 21, zoom lens 22, or the variable aperture stop of projection optical system PL. In this case as well, because the variation range of the annular ratio by conic axicon 21 is limited, the plurality of diffractive optical elements with different characteristics are to be used, switching the diffractive optical elements when necessary.

Further, in the case of normal illumination, conic axicon 21 only functions as a planar parallel plate because the distance between the first and the second prism members 21a and 21b is substantially zero, however, by zoom lens 22, the size of the illumination light on the pupil plane of the illumination optical system is variable. The σ value is also variable by zoom lens 22 and/or the variable aperture stop of projection optical system PL. However, due to restrictions in optical design, there is actually a limit in the variable power range of the outside diameter by zoom lens 22. Therefore, in the embodiment, as diffractive optical element 18C for normal illumination, a plurality of diffractive optical elements, e.g. two, with different characteristics are provided. More specifically, one of the diffractive optical elements for normal illumination forms a circular secondary light source suitable when the σ value varies in the range of a relatively small σ value (small σ) to a moderate σ value (moderate σ). Further, the other diffractive optical element for normal illumination forms a circular secondary light source suitable when the σ value varies in the range of the moderate σ value (moderate σ) to a relatively large σ value (large σ). As a consequence, with zoom lens 22 and the two diffractive optical elements for normal illumination, it becomes possible to change the σ value in the range of a small σ to a large σ (e.g. $0.1 \leq \sigma \leq 0.95$)

Next, a description will be made on an example of a reticle $R_T$ used in exposure apparatus 100 for forming a wiring groove pattern used for copper wiring.

Figure 2:
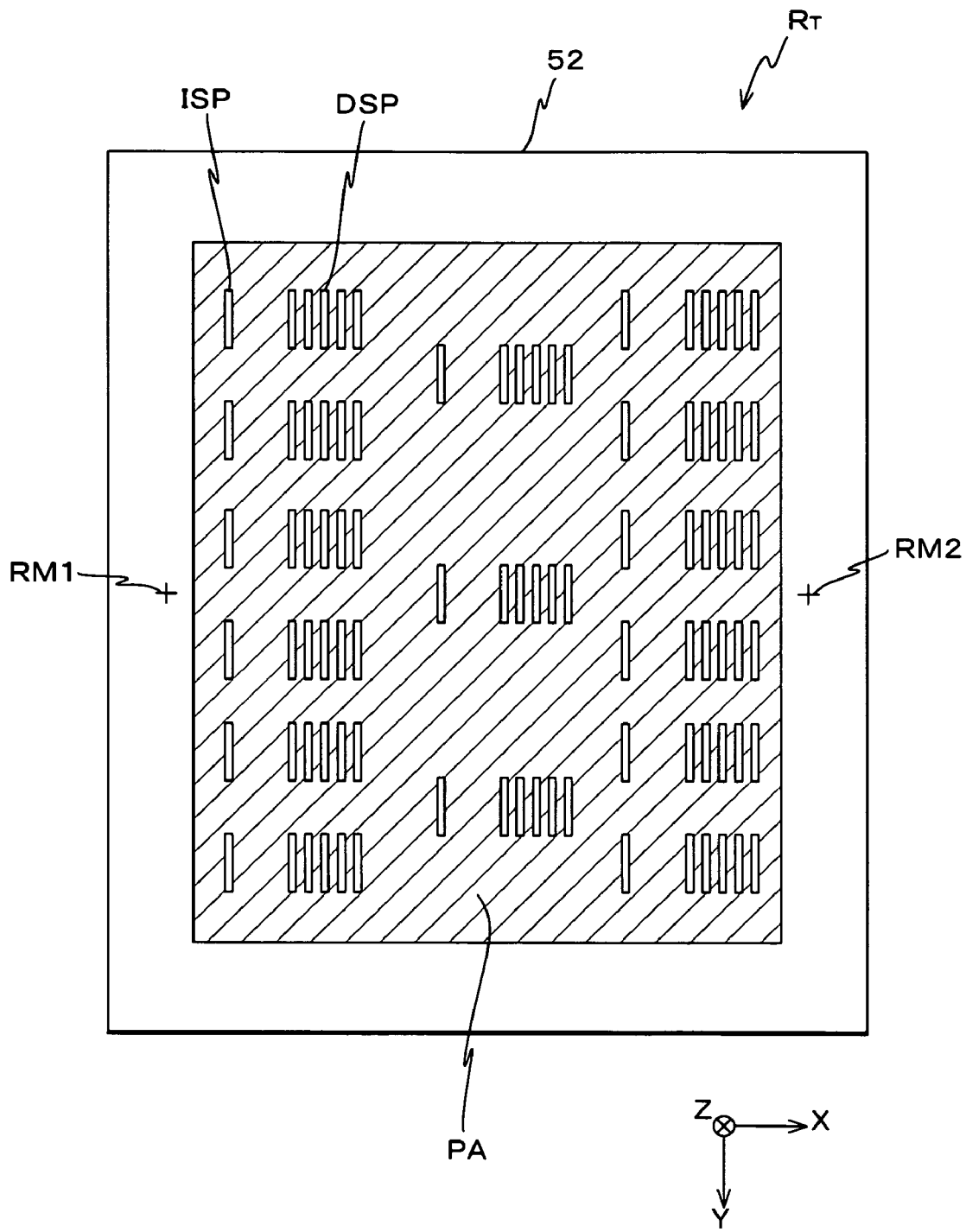
FIG. 2 is a planar view that shows an example of a reticle used for forming a wiring groove pattern in the exposure apparatus of the first embodiment.
Figure 3:
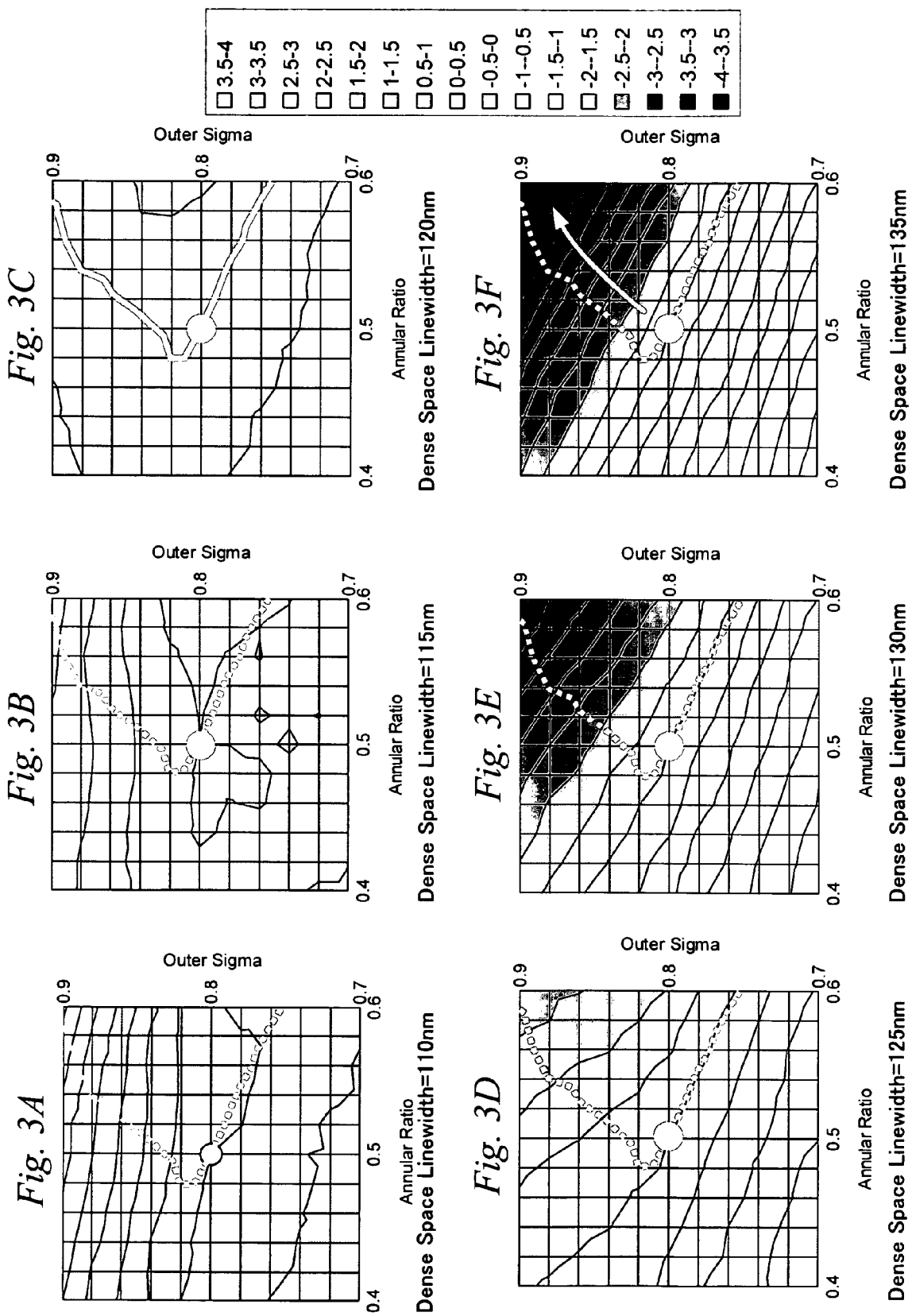
FIGS. 3A to 3F are views that show an example of simulation results for obtaining adjustment data of an illumination condition, and are views that show a variation of a relative linewidth bias corresponding to the illumination condition when a linewidth of a dense space pattern is 110 nm, 115 nm, 120 nm, 125 nm, 130 nm, and 135 nm, respectively.

FIG. 2 shows an example of reticle $R_T$. FIG. 2 is a planar view of reticle $R_T$ when viewed from the pattern surface side (the lower surface side in FIG. 1). As is shown in FIG. 2, reticle $R_T$ is made of a glass substrate 52 (e.g. synthetic silica glass or the like), and on one surface, a substantially rectangular pattern area PA set by a light shielding area is formed. In the embodiment, almost all the entire surface of pattern area PA is a light shielding section by the light shielding member such as chromium or the like. Within pattern area PA, a plurality of isolated patterns ISP and a plurality of dense patterns DST are formed in a predetermined positional relation. In this example, patterns ISP and DSP are both space patterns (aperture patterns) that are formed by a light transmitting section within a light shielding section. In reticle $R_T$ in FIG. 2, almost all the entire surface of pattern area PA is a light shielding section, however, for example, the light shielding section may simply be the formation area of patterns ISP and DSP.

In this case, isolated pattern ISP is a line shaped space pattern that extends in the Y-axis direction and has a linewidth of, for example, 540 nm. Dense pattern DSP is a periodic pattern that has five line shaped space patterns extending in the Y-axis direction with a linewidth of, for example, 400 nm, lined in the X-axis direction at a pitch of 800 nm. In FIG. 2, patterns ISP and DSP are illustrated much larger than the actual size for the sake of convenience.

On both sides in the X-axis direction of pattern area PA with respect to the center of reticle $R_T$ (substantially coincides with the center of pattern area PA), a pair of reticle alignment marks RM1 and RM2 is formed.

In exposure apparatus 100 of the embodiment, in order to obtain the resist image and the image after etching of a space pattern that has a desired device linewidth characteristics, adjustment data of illumination conditions are obtained in advance, and is stored in memory within control system 50. In the description below, an example of a simulation for obtaining the adjustment data of illumination conditions will be described.

First of all, the exposure condition of the simulation will be described. In this exposure condition (hereinafter, standard exposure condition), the exposure light is an ArF excimer laser beam having a wavelength of 193 nm, the numerical aperture of the projection optical system is 0.78, the illumination condition is an annular illumination in which the σ value equals 0.8 and the annular ratio equals 0.5, and a reticle is used on which an isolated space pattern with a linewidth of 135 nm and a dense space pattern with a linewidth of 100 nm and a 200 nm pitch are formed. And, by the exposure under the standard illumination condition using the reticle, a resist image of the isolated space pattern with a linewidth of 150 nm and a resist image of the dense space pattern with a linewidth of 120 nm are formed on the wafer. In this simulation, the projection magnification of the projection optical system is set to an equal magnification.

FIG. 3C shows the difference between a difference (hereinafter referred to as an "isolated-dense difference" or a "linewidth bias") in the linewidths of the resist images of the isolated space pattern and the dense space pattern when the illumination condition is altered under this exposure condition, such as for example, the σ value altered in the range of 0.7 to 0.9 and the annular ratio altered the range of 0.4 to 0.6, and the isolated-dense difference (linewidth bias) under the above standard exposure position, i.e. the variation of the relative linewidth bias. In the change of the σ value (illumination σ) and the annular ratio in the above range, the linewidth of the resist image of the dense space pattern is maintained at 120 nm. Accordingly, the variation of the relative linewidth bias in FIG. 3C reflects the linewidth change in the resist image of the isolated space pattern. Further, the white contour line in FIG. 3C shows a contour line when the above relative linewidth bias is zero (more specifically, a contour line that connects the exposure condition (illumination condition) when the isolated-dense difference (linewidth bias) is the same as the isolated-dense difference (linewidth bias) under the standard exposure condition (standard illumination condition)).

Further, FIGS. 3A, 3B, 3D, 3E, and 3F show a similar variation of the relative linewidth bias as in FIG. 3C, in the case the linewidth of the resist image of the dense space pattern is 110 nm, 115 nm, 125 nm, 130 nm, and 135 nm, respectively. Further, in these FIGS. 3A, 3B, 3D, 3E, and 3F, the white contour line in FIG. 3C is shown in a dotted line.

For example, as is shown with the white arrow in FIG. 3F, when the illumination condition is changed so that both the σ value and the annular ratio become larger on the dotted line, it can be seen that the isolated-dense difference of the linewidth at the top of the resist image of the space pattern (the linewidth at the height position where the linewidth becomes 135 nm) can be changed in a direction in which the linewidth of the resist image of the isolated space pattern becomes wider (degrade the profile), without changing the linewidth bias (the isolated-dense difference of the linewidth at the bottom) of the resist image of the space pattern.

In the embodiment, information that shows the relation between the illumination condition and the relative linewidth bias as is shown in FIGS. 3A to 3F is obtained by simulation (or by experiment) in advance for various target linewidths, and the information is stored in memory in control system 50.

Figure 4:
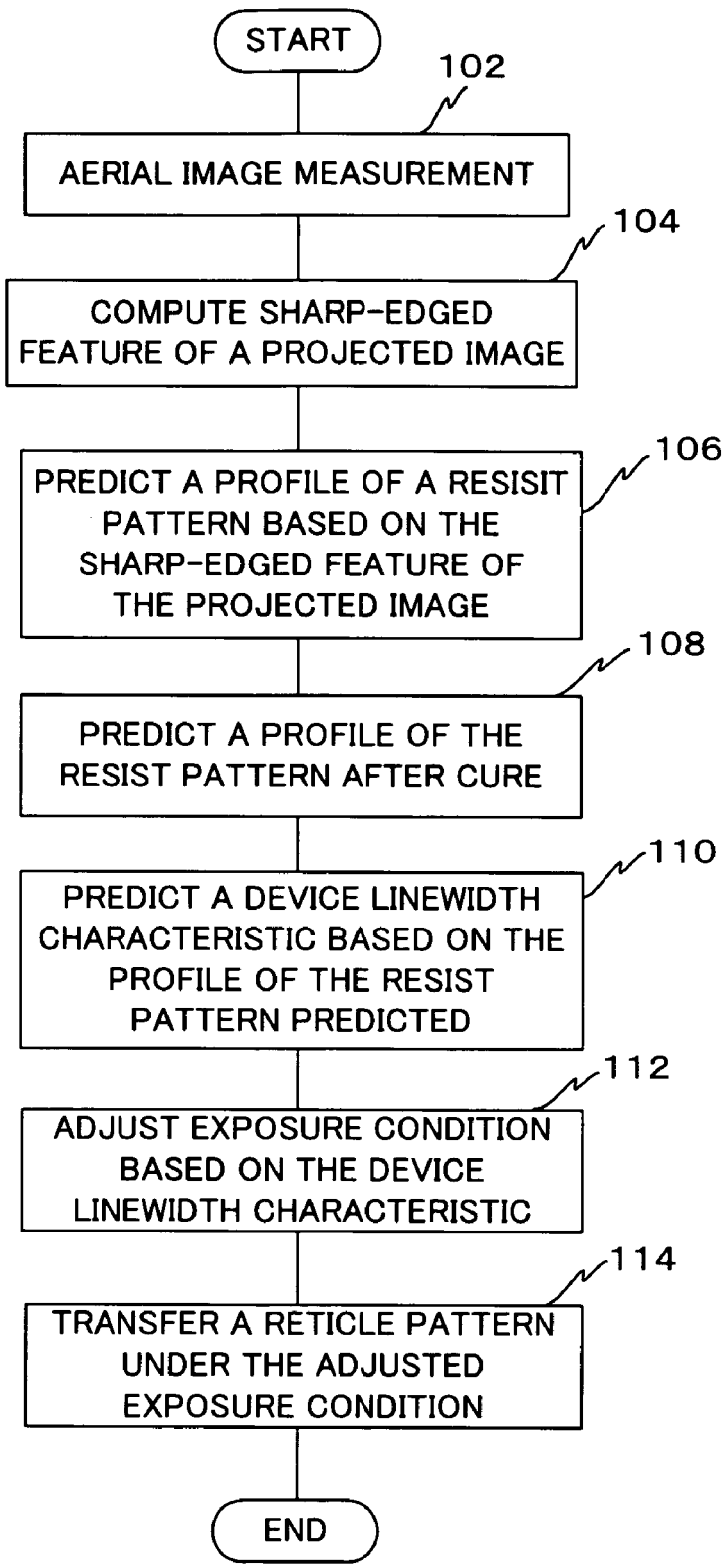
FIG. 4 is a flow chart that shows a processing algorithm of a control system when exposure of a wafer is performed using a reticle in the exposure apparatus of the first embodiment.

Next, a processing flow when the exposure of wafer W is performed using reticle $R_T$ described earlier will be described, according to a flow chart in FIG. 4, which shows a processing algorithm of a control system.

First of all, in step 102, reticle $R_T$ is loaded onto reticle stage RST via a reticle carrier system (not shown), and using the aerial image measuring instrument previously described, aerial image measurement by the slit-scan method is performed in the procedure disclosed in, for example, Kokai (Japanese Unexamined Patent Application Publication) No. 2002-198303, and the corresponding U.S. Patent Application Publication No. 2002/0041377 and the like previously described, so as to obtain information on the aerial image intensity distribution (projected image intensity distribution) of the patterns ISP and DSP on reticle $R_T$.

In the next step, step 104, the sharp-edged feature of the projected image is computed, using the projected image intensity distribution that has been obtained. More specifically, for example, a differential value of the projected image intensity distribution at an intersection position with a slice level corresponding to the resist sensitivity (i.e. the slope of the tangent line at the intersecting position), or a log slope of the projected image intensity distribution at the intersecting point is computed as the sharp-edged feature of the projected image. In this case, brightness of the image may affect the former differential value. In such a case, it is desirable to employ the latter log slope, which can eliminate the influence of the brightness. Besides such methods, contrast of the projected image can be computed as the sharp-edged feature.

In the next steps, steps 106 to 110, device linewidth characteristics are predicted, based on the sharp-edged feature of the projected image that has been computed.

To be more specific, first, in step 106, the profile of the resist pattern (resist image) is predicted based on the sharp-edged feature of the projected image. For example, when considering the case of the projected image of isolated pattern ISP, as the projected image of pattern ISP, for example, an image shown in the lower section of FIG. 7A or 7B is obtained. If the differential value (the slope of the tangent line) (or the log slope) at intersecting points $P_1$ and $P_2$ with slice level SL corresponding to the projected image and the resist sensitivity can be obtained, then, based on the differential value (or the log slope) and a projected image linewidth $WD_b$ having a length of line segment $P_1$ to $P_2$, the profile of the resist image can be roughly predicted. Accordingly, the profile of the resist images shown in, for example, the upper section of FIGS. 7A and 6A or FIGS. 7B and 6B, can be obtained. The height of the resist image (the thickness of the resist layer), in this case, is already known.

In the next step, step 108, a profile of the resist image after cure is predicted, further taking into consideration the deformation due to the cure treatment. Accordingly, the profile of the resist image deformed by the cure treatment (heating or ultraviolet light irradiation (UV cure) for hardening the resist) is predicted, such as for example, the image shown in the middle section of FIG. 6A. However, because the deformation due to the cure treatment may be small in some cases, the deformation due to the cure treatment does not necessarily have to be considered (the processing in step 108 is not indispensable).

In the next step, step 110, device linewidth characteristics are predicted, based on the profile of the resist image that has been predicted. In this case, the device linewidth characteristics can be predicted by computing the linewidth of the pattern after etching formed on the wafer that has undergone the etching process of a predetermined film (e.g. interlayer insulating film) that uses the resist image as a mask, based on the above profile of the resist image. Or, in addition to the above profile of the resist image, the device linewidth characteristics can also be predicted by computing the linewidth of the pattern after etching also taking into consideration etching characteristics in the etching process performed after development or after cure.

In the description, etching characteristics refer to a selection ratio, which is mainly an etching velocity ratio of a resist and a film under the resist subject to processing (etching), however, density difference and/or P–N difference can also be included. Density difference refers to the difference in characteristics such as the etching speed, the shape or the like in the coarse section and the dense section of the pattern. P–N difference refers to the difference in the etching characteristics due to the difference in the P-structure and N-structure of a semiconductor. Depending on the cases, isotropy and anisotropy of the etching can also be included as the etching characteristics.

In the next step, step 112, the exposure condition is adjusted so that an etched image (pattern after the etching) that has a desired linewidth is obtained, based on the device linewidth characteristics that have been predicted.

For example, in the case exposure is performed under the standard exposure condition previously described based on the difference in the linewidth of the etched image that has been predicted and the desired linewidth, an exposure amount (a total energy amount of the illumination light irradiated on the wafer via the pattern) in which the linewidth of the resist image of each space of pattern DSP becomes a desired linewidth is computed (that is, the exposure amount is corrected based on the predicted device linewidth characteristics (the above linewidth difference)).

Next, based on the information that shows the relation between the standard illumination condition and the relative linewidth bias previously described, illumination σ and/or the annular ratio are adjusted via drive system 36 (and 38) and drive system 40 described earlier so that the bottom width and the top width of the resist images of pattern ISP and pattern DSP become a desired value, respectively.

In the next step, step 114, exposure by the step-and-scan method is performed under the adjusted exposure condition (including the computed exposure amount and the adjusted illumination condition), and after the pattern of reticle $R_T$ is transferred onto each shot area of wafer W whose surface is coated with a resist, the processing in the main routine is completed.

Then, wafer W on which the pattern of reticle $R_T$ is transferred is unloaded from wafer stage WST and carried to a coater developer (not shown), and is developed. Accordingly, on wafer W, the resist images of pattern ISP and pattern DSP that have the desired linewidth and profile are formed.

Next, the manufacturing method of a semiconductor device in the embodiment will be described, referring to FIGS. 5A to 5E.

Figure 5A:
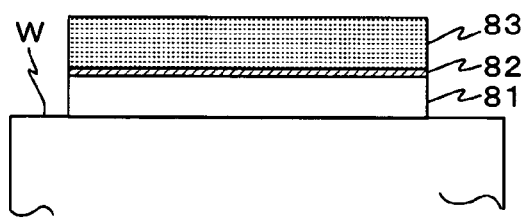
FIGS. 5A to 5E are views for explaining a manufacturing method of a semiconductor device in the first embodiment.

First of all, a semiconductor base material is prepared. For example, a semiconductor substrate (wafer) W on which a lower layer wiring 81 (a first copper wiring layer) is formed by undergoing film formation of an interlayer insulating film and resist patterning after going through a device isolation region formation process, a well formation process, and a transistor formation process is prepared. Then, on the wafer, a diffusion prevention film 82 is formed (FIG. 5A). As lower layer wiring 81, for example, a tungsten plug that reaches the diffusion layer of a MOS transistor can be used. For the sake of simplicity in the description, the configuration of lower layer wiring 81 is not shown in FIGS. 5A to 5E.

As diffusion prevention film 82, for example, a SiN (Silicon Nitride) film, a SiC (Silicon Carbide) film, a SiCN (Silicon Carbon Nitride) film or the like can be used. In the case a material that has a large etching selection ratio to the interlayer insulating film formed on diffusion prevention film 82 is used as diffusion prevention film 82, then the film also functions as an etching stopper film.

Next, on diffusion prevention film 82, an interlayer insulating film 83 is formed, for example, by a plasma CVD (Chemical Vapor Deposition) method or the like (FIG. 5A). As interlayer insulating film 83, in this case, a low dielectric constant insulating film (a Low-k film) is used. The thickness of interlayer insulating film 83 is, for instance, around 200 to 600 nm. It is preferable that the dielectric constant of the interlayer insulating film is around 2.0 to 2.5

In the embodiment, as the insulating film that composes interlayer insulating film 83, an insulating film that has a dielectric constant lower than an $SiO_2$ film is used. More specifically, an $SiO_2$ film that has a silicon atom bound with a hydrogen atom, an alkyl group such as a methyl radical ($—CH_3$), or an allyl group ($CH_2=CHCH_2—$) can be given. For example, an MSQ (methylsilsesquioxane) film or an HSQ (hydrogen silsesquioxane) film is suitable.

After interlayer insulating film 83 has been formed, a cap film 85 is formed (FIG. 5B) on interlayer insulating film 83. Cap film 85 functions as a protective film of interlayer insulating film 83 in the CMP process by the damascene method. As cap film 85, for example, an $SiO_2$ (Silicon Oxide) film, an SiC (Silicon Carbide) film, an SiN (Silicon Nitride) film or the like can be used. These films can be formed, for example, by the CVD method.

Figure 5D:
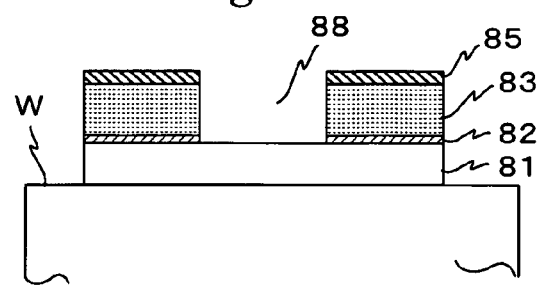
Figure 5B:
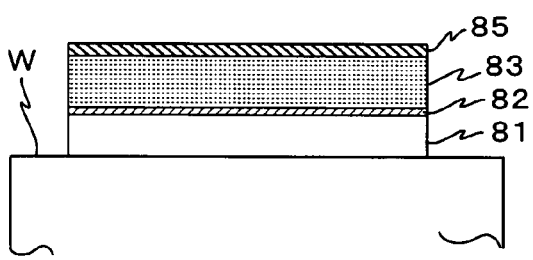
Figure 5E:
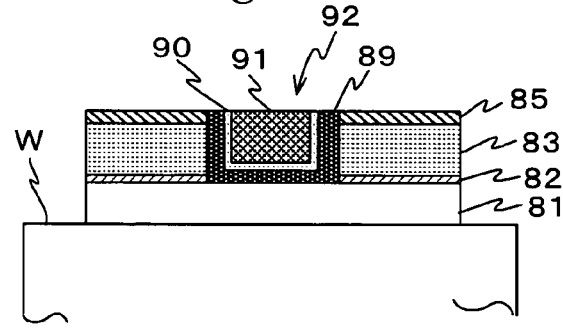
Figure 5C:
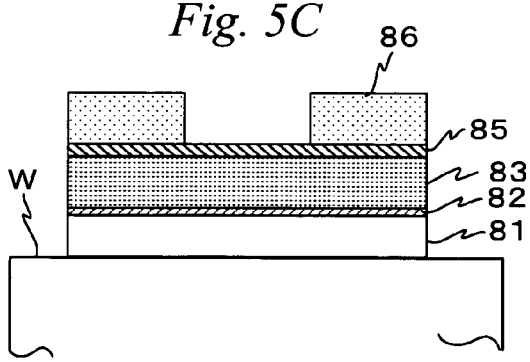

After cap film 85 ahs been formed, a predetermined resist pattern, or in other words, a resist film 86 that has a predetermined pattern profile is formed (FIG. 5C).

More specifically, wafer W on which lower layer wiring 81, diffusion prevention film 82, interlayer insulating film 83, and cap film 85 are deposited is carried to the coater developer, and a photosensitive agent (resist) is coated. Then, successively, the wafer on which the resist is coated is carried onto wafer stage WST of exposure apparatus 100 in the embodiment, which is inline connected to the coater developer. Then, after preparatory operations have been performed, which are predetermined, exposure is performed under the exposure condition that has been adjusted in the procedure previously described, and the pattern of reticle $R_T$ described earlier is transferred onto wafer W.

Next, wafer W that has been exposed is carried to the coater developer, and then is developed. Accordingly, on wafer W, the resist images of pattern ISP and pattern DSP that have the desired linewidth and profile are formed. In FIG. 5C, the resist image of pattern ISP that has been formed in the manner described above is representatively indicated as resist film 86. And, cure treatment as in heat treatment (post-bake treatment) and ultraviolet light irradiation treatment is applied when necessary.

Next, dry etching is applied to cap film 85, interlayer insulating film 83, and diffusion prevention film 82 with resist film 86 serving as a mask, so as to form the wiring groove (depressed section) that reaches lower layer wiring 81. By removing resist film 86 that has become unnecessary by ashing after dry etching has been completed, a wiring groove 88 that reaches lower layer wiring 81 is formed, as is shown in FIG. 5D.

In the case diffusion prevention film 82 also functions as the etching stopper film, a first dry etching can be performed on cap film 85 and interlayer insulating film 83 with resist film 86 serving as a mask, then ashing and cleaning can be performed in order to remove resist film 86 that has become unnecessary, and then a second dry etching can be performed on diffusion prevention film 82 with cap film 85 as a hard mask. And, wiring groove 88 that reaches lower layer wiring 81 can also be formed in the manner described above.

After wiring groove 88 has been formed, etching residue is removed by a cleaning treatment. Then, a copper wiring layer is embedded inside wiring groove 88 using a known plating method and/or a sputtering method and the like, and a wiring groove 92 electrically connecting to lower layer wiring 81 is formed. And, by CMP, the surface of wiring groove 92 is flattened.

According to the processes described above, wiring groove 92 electrically connecting to lower layer wiring 81 can be formed (FIG. 5E). In FIG. 5E, reference numeral 89 indicates a barrier metal film made of, for example, a Ta (Tantalum) film, a TaN (Tantalum Nitride) film, a W (Tungsten) film, a WN (Tungsten Nitride) film, a Ti (Titanium) film, a TiN (Titanium Nitride) film or the like. Further, reference numeral 90 indicates a seed Cu (copper) film and reference numeral 91 indicates a Cu layer, respectively. Barrier metal film 89 and seed Cu (copper) layer 90 can be formed by the sputtering method. Further, Cu layer 91 can be formed by the plating method.

Then, after forming a via plug electrically connecting to wiring groove 92, a multilayer wiring structure can be formed by repeating a similar process.

Next, device assembly is performed using the wafer on which the multilayer wiring structure is formed. In the assembly process, processes such as a dicing process, a bonding process, a packaging process (chip encapsulation) and the like are included as necessary.

Finally, tests on operation, durability, and the like are performed on the device that has been made.

As is described so far, according to the wafer processing method related to the embodiment, the profile of the resist pattern is predicted based on the sharp-edged feature of the projected image of a predetermined pattern, such as for example, patterns ISP and DSP on reticle $R_T$ (steps 106 and 108), and based on the predicted profile the device linewidth characteristics are predicted (step 110), and then the exposure conditions of pattern ISP and DSP are adjusted based on the device linewidth characteristics that have been predicted (step 112). Accordingly, by performing exposure under the adjusted exposure conditions, or in other words, by performing patterning of the resist on wafer W with the projected image of the pattern (step 114), and developing the wafer after the patterning, the resist pattern that satisfies the desired device linewidth characteristics is formed on the wafer. Furthermore, by performing the etching of the wafer using the resist pattern as a mask, a pattern (groove) that has the desired linewidth can be formed after the etching.

Further, according to the device manufacturing method of the embodiment, in the wafer processing step, because the grooves for wiring is formed using the above wafer processing method, the width of each wiring groove becomes a desired value. For example, the grooves after etching that correspond to the resist patterns with the same linewidth are grooves that have the same linewidth. Accordingly, generation of unevenness and variation in the finished size of the device can be suppressed, and a device with a good operation speed (small signal delay) can be manufactured with good yield.

In the embodiment, the exposure condition, i.e. the exposure amount and the illumination condition (the illumination σ and the annular ratio), was adjusted based on the device linewidth characteristics that had been predicted (e.g. the difference between the predicted linewidth of the etched image and the desired linewidth). However, the present invention is not limited to this, and instead of the exposure amount and/or the illumination condition, or in addition to the exposure amount and/or the illumination condition, other exposure conditions can also be adjusted. Other exposure conditions include, for example, the optical properties of projection optical system PL (aberration, numerical aperture or the like), or as is disclosed in, for example, U.S. Pat. No. 5,742,376, RE37,391 and the like, the implementation status of a super-resolution technique for substantially increasing the depth of focus by continuously setting a predetermined point on the wafer during scanning exposure to a different Z position, the fluctuation (movement range) in the Z-axis direction and the like. Further, in the adjustment of the illumination condition, the intensity (energy) distribution of the illumination light on the pupil plane of illumination optical system 12, or in other words, the shape of the secondary light source was maintained substantially the same while adjusting its magnitude (the illumination σ and the annular ratio). However, the present invention is not limited to this, and for example, altering the shape of the secondary light source (such as, from annular illumination to quadrupole illumination), adjusting the polarization state and/or the spectral characteristics (e.g. center wavelength, wavelength interval) and the like can also be performed. On adjusting the spectral characteristics, for example, at least one of a first spectral width (e.g. 95% energy purity width (E95)), which is set based on the integration value of spectral intensity distribution of the illumination light, a second spectral width (e.g. full width half maximum (FWHM)), which is the width when the intensity decreases to a predetermined rate with respect to a peak value of the spectral intensity distribution, and the ratio of the first spectral width and the second spectral width is adjusted. Furthermore, adjusting the exposure conditions can also include a reticle pattern correction (linewidth adjustment that will be described later in a second embodiment, and/or addition of an auxiliary pattern) called OPC (Optical Proximity Correction) whose details are disclosed in, for example, U.S. Pat. No. 5,546,225 and the like.

Next, a second embodiment will be described. The second embodiment is an embodiment on a method of manufacturing a reticle such as, for example, reticle $R_T$ previously described.

In the second embodiment, the same processing as in steps 102 to 110 in the first embodiment previously described is performed, and after the device linewidth characteristics are predicted, the linewidth of at least a part of the space pattern data of the pattern data corresponding to patterns ISP and DSP formed on reticle $R_T$ as the exposure condition is adjusted, based on the prediction results.

Then, using the pattern data whose linewidth has been adjusted, a plurality of patterns ISP and DSP that have the desired linewidth are formed in a predetermined position relation within pattern area PA formed on one of the surfaces of glass substrate 52, as is shown in FIG. 2. Patterns ISP and DSP can be formed, for instance, under the procedures of coating an electron beam resist on the surface of the light shielding member such as such as chromium or the like that forms pattern area PA, exposing the resist using an electron beam exposure apparatus, and etching the light shielding member after development using the resist pattern as a mask.

Reticle $R_T$ manufactured in the manner described above is loaded, for example, into exposure apparatus 100, and exposure by the step-and-scan method is performed under the standard exposure condition described earlier using reticle $R_T$ that has been manufactured, so as to transfer the pattern of reticle $R_T$ onto each of the shot areas on wafer W. Then, by developing the wafer, the resist images of patterns ISP and DSP that have a desired linewidth and profile are formed on wafer W.

In the second embodiment, in addition to the pattern correction (linewidth adjustment) during the manufacture of the reticle described earlier, the exposure condition (e.g. at least one of the illumination condition and the exposure amount) can be adjusted as in the first embodiment while exposure using the reticle that has been manufactured is performed. Further, in the second embodiment, the pattern correction during reticle manufacturing is not limited to the linewidth, and for example, an auxiliary pattern can be added instead of, or in addition to the correction of the linewidth.

In each of the embodiments above, the profile of the resist pattern was predicted based on the sharp-edged feature of the projected image of patterns ISP and DSP, and the device linewidth characteristics were predicted based on the predicted profile. The present invention, however, is not limited to this, and the device linewidth characteristics can be predicted based on the sharp-edged feature of the projected image of the pattern.

Further, in each of the embodiments above, the case has been described where exposure is performed using reticle $R_T$ on which isolated pattern ISP and dense pattern DSP are formed. The present invention, however, is not limited to this, and exposure can be performed using a reticle that has only isolated patterns, or only dense patterns formed. In this case, the exposure condition does not have to be adjusted in order to adjust the isolated-dense difference (linewidth bias) as was performed in each of the embodiments above. In this case, for example, by experiment or simulation, the relation between the sharp-edged featured of the projected image of the pattern and the device linewidth characteristics (and the profile of the resist pattern), and the relation between the device linewidth characteristics and the exposure condition (including for example, at least one of the exposure amount and the illumination condition) are obtained in advance. Then, during the actual exposure, by measuring the intensity distribution of the aerial image (projected image) of the pattern using the aerial image measuring instrument, predicting the device linewidth characteristics based on the measurement results (the sharp-edged featured of the projected image), and transferring the pattern after adjusting the exposure condition based on the predicted linewidth characteristics, the resist image of the pattern with a desired linewidth, and consequently the pattern image after etching with a desired linewidth can be obtained.

Further, the difference in the profile due to the influence of the intensity distribution (brightness distribution) of the secondary light source can also be corrected by changing the illumination condition, such as, for example, changing the shape and size of the secondary light source, or in other words, changing the σ value, the annular ratio and the like. In each of the embodiments above, the description focused on groove patterns and wiring layers, however, other patterns and other layers are also acceptable. Furthermore, the reticle pattern can also be a pattern formed by a light shielding section within the light transmitting section. Further, in the annular illumination or the multipole illumination, in the intensity distribution of the illumination light on the pupil plane of the illumination optical system, the intensity in the areas other than the annular area or the plurality of areas eccentric from optical axis AX does not have to be zero. That is, the intensity of the illumination light in the annular area or the plurality of areas eccentric from optical axis AX only has to be higher than the other areas.

In conic axicon 21 in each of the embodiments above, the first prism member 21a that has a concaved conical refracting surface and the second prism member 21b that has a convexed conical refracting surface are place sequentially from the light source side, however the arrangement order can be reversed. Further, the configuration of the illumination optical system in each of the embodiments above is a mere example, and the configuration is optional as long as the illumination condition including the annular ratio and the illumination σ can be adjusted. Accordingly, various configurations can be employed, such as the illumination optical system disclosed in, for example, Kokai (Japanese Unexamined Patent Application Publication) No. 2002-231619, and the corresponding U.S. Patent Application Publication No. 2004/0263817. For example, as optical integrator 24, instead of the fly-eye lens, an internal reflection type integrator (such as a rod), a diffractive optical element or the like can be used.

Further, in each of the embodiments above, as the illumination light, as is disclosed in, for example, the pamphlet of International Publication WO1999/46835 and the corresponding U.S. Pat. No. 7,023,610 and the like, a harmonic wave may also be used that is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal.

Further, as the light source, a light source that generates a vacuum ultraviolet light such as an $F_2$ laser having a wavelength of 157 nm, a $Kr_2$ laser beam having a wavelength of 146 nm, an $Ar_2$ laser beam having a wavelength of 126 nm, or a mercury lamp that generates a bright line such as the g-line or the i-line can also be used.

Further, the magnification of the projection optical system is not limited to a reduction system, and the system may either be an equal magnifying system or a magnifying system. The projection optical system is not limited to a refracting system, and the system can be one of a reflection system and a catadioptric system (for example, an in-line type catadioptric system whose details are disclosed in, for example, the pamphlet of International Publication Number WO2004/019128 and the corresponding U.S. Patent Application 2006/0121364), and the projected image can be one of an inverted image or an upright image.

In each of the embodiments above, the case has been described where the present invention is applied to a scanning exposure apparatus by the step-and-scan method. The present invention, however, is not limited to this, and it can also be suitably applied to an exposure apparatus by the step-and-repeat method (the so-called stepper) or to an exposure apparatus by the step-and-stitch method.

Besides the exposure apparatus above, the present invention can also be applied to a liquid immersion exposure apparatus in which liquid is filled in the space between projection optical system PL and the wafer as in the apparatus disclosed in, for example, the pamphlet of International Publication Number WO2004/053955 and the corresponding U.S. Patent Application 2005/0252506, European Patent Application Publication No. 1,420,298, the pamphlet of International Publication Number WO2004/055803, U.S. Pat. No. 6,952, 253 and the like. Further, the present invention can also be applied to a multi-stage exposure apparatus provided with a plurality of stages whose details are disclosed in, for example, Kokai (Japanese Unexamined Patent Publication) No. 10-163099 (and the corresponding U.S. Pat. No. 6,590,634), Kohyo (Japanese Unexamined Patent Publication) No. 2000-505958 (and the corresponding U.S. Pat. No. 5,969,441), U.S. Pat. No. 6,208,407 and the like, or the present invention can also be applied to an exposure apparatus provided with a measurement stage that has a measurement member (such as a fiducial mark, a sensor or the like), as is disclosed in, for example, Kokai (Japanese Unexamined Patent Publication) No. 11-135400 (and the corresponding pamphlet of International Publication Number WO1999/23692), Kokai (Japanese Unexamined Patent Publication) No. 2000-164504 (and the corresponding U.S. Pat. No. 6,897,963) and the like.

Furthermore, the present invention can also be suitably applied not only to an exposure apparatus that uses ultraviolet light as the illumination light but also to an exposure apparatus that uses a charged particle beam such as an electron beam or an ion beam, or to an X-ray exposure apparatus. Incidentally, the electron beam exposure apparatus can be an apparatus by any one of a pencil beam method, a variable-shaped beam method, a self-projection method, a blanking aperture array method, and a mask projection method. For example, in the case of the apparatus that employs the pencil beam method, the device linewidth characteristics can be predicted based on the resist image profile measured in advance, and the exposure amount serving as the exposure condition of the pattern can be adjusted by increasing or decreasing the exposure energy based on the predicted device linewidth characteristics. Further, the linewidth can be adjusted as the exposure condition, based on the device linewidth characteristics.

In each of the embodiments above, a transmittance type mask (reticle) was used, which is a transmissive mask on which a predetermined light shielding pattern (or a phase pattern or a light attenuation pattern) is formed. Instead of this mask, however, as is disclosed in, for example, U.S. Pat. No. 6,778,257, an electron mask (a variable shaped mask) on which a light-transmitting pattern, a reflection pattern, or an emission pattern is formed according to electronic data of the pattern that is to be exposed can also be used. With the variable shaped mask that uses a DMD (Digital Micromirror Device), which is a kind of a non-radiative image display device (also referred to as a spatial optical modulator), after the device linewidth characteristics are predicted, the design data of the pattern that is to be generated by the electron mask can be corrected and linewidth adjustment can be performed as the exposure condition of the pattern based on the prediction results in order to obtain and etched image that has a desired linewidth, as in the second embodiment previously described.

Further, the present invention can also be applied to an exposure apparatus that forms a device pattern on wafer W (a lithography system) by forming an interference fringe on wafer W, as is disclosed in, for example, the pamphlet of International Publication Number WO2001/035168. Furthermore, the present invention can also be applied to an exposure apparatus that synthesizes a pattern of a plurality of reticles (or variable shaped masks) on the wafer via the projection optical system, and performs double exposure of an area on the wafer almost simultaneously in one scanning exposure, as is disclosed in, for example, Kohyo (Japanese Unexamined Patent Publication) No. 2004-519850 (and the corresponding U.S. Pat. No. 6,611,316).

The present invention is not limited to the exposure apparatus for manufacturing semiconductors, and it can also be widely applied to an exposure apparatus used for manufacturing displays such as the liquid crystal display device made of square glass plates or the like, or to an exposure apparatus used for manufacturing thin film magnetic heads, imaging devices (such as CCDs), micromachines, DNA chips and the like. Further, the present invention can also be applied to an exposure apparatus that transfers a circuit pattern onto a glass substrate or a silicon wafer not only when producing microdevices such as semiconductors, but also when producing a reticle or a mask used in exposure apparatus such as an optical exposure apparatus, an EUV exposure apparatus, an X-ray exposure apparatus, and an electron beam exposure apparatus. The object subject to exposure is not limited to wafers, and for example, the object can be a glass plate, a ceramic substrate, a film member, a mask blank or the like, and the shape is also not limited to a circular shape and can be rectangular instead.

The above disclosures of the Kokai/Kohyo publications, the pamphlet of the International Publications, the U.S. Patents, and the U.S. Patent application publications are each incorporated herein by reference.

Further, in each of the embodiments above, the case has been described of a device manufacturing method that includes a wiring process in which copper wiring is formed by a single damascene process. The present invention is not limited to this, and the present invention can also be similarly applied to a device manufacturing method that includes a wiring process in which metal wiring is formed by a dual damascene process. Further, besides the description above, in the case a transistor gate is formed by an embedding method similar to the single damascene process previously described, a groove of the gate can be formed on the wafer using the substrate processing method in the present invention.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A substrate processing method that comprises a patterning process of a resist on a substrate by exposure, the method comprising:
   predicting a device linewidth characteristic based on a sharp-edged feature of a projected image of a predetermined pattern,
   wherein the sharp-edged feature is a feature that shows a change in a projected image linewidth with respect to a change in a slice level, the projected image linewidth being a distance between two intersecting points of the projected image and the slice level;
   adjusting an exposure condition of the predetermined pattern based on the device linewidth characteristic that has been predicted; and
   patterning the resist on the substrate by exposing the substrate to the adjusted exposure condition.

2. The substrate processing method of claim 1 wherein, the sharp-edged feature is a differential value at an intersection position with a level corresponding to a resist sensitivity in an image intensity distribution of the projected image.

3. The substrate processing method of claim 1 wherein, the sharp-edged feature is a log slope at an intersection position with a level corresponding to a resist sensitivity in an image intensity distribution of the projected image.

4. The substrate processing method of claim 1 wherein, the sharp-edged feature is a contrast of the projected image.

5. The substrate processing method of claim 1 wherein, in the predicting the device linewidth characteristic, a profile of a resist pattern that can be obtained through the patterning process and a development process is used.

6. The substrate processing method of claim 1 wherein, in the predicting the device linewidth characteristic, a profile of a resist pattern is predicted based on the sharp-edged feature of the projected image, whereby the device linewidth characteristic is predicted based on the profile of the resist pattern that has been predicted.

7. The substrate processing method of claim 6 wherein, the profile of the resist pattern is predicted taking into consideration a deformation of the resist pattern due to a heating treatment.

8. The substrate processing method of claim 1, the method further comprising:
   a developing process and an etching process after the patterning of the resist, wherein
   in the predicting the device linewidth characteristic, the device linewidth characteristic is predicted based on the sharp-edged feature of the projected image of the predetermined pattern and an etching characteristic in the etching process.

9. The substrate processing method of claim 8 wherein, in the adjusting the exposure condition, the exposure condition is adjusted to make a linewidth of a pattern after etching become a desired value based on the device linewidth characteristic that has been predicted.

10. The substrate processing method of claim 1 wherein, the exposure condition includes at least one of an exposure amount, a linewidth, and an illumination condition of the pattern.

11. The substrate processing method of claim 10 wherein, the exposure condition includes at least the linewidth of the pattern, and the exposure condition is adjusted by changing a linewidth of a pattern formed on a photomask.

12. The substrate processing method of claim 10 wherein, the exposure condition includes at least the exposure amount, and the exposure condition is adjusted by changing at least an energy amount of an energy beam irradiated on the resist during the exposure.

13. The substrate processing method of claim 10 wherein, the exposure condition includes at least the illumination condition, and the exposure condition is adjusted by changing an energy distribution on a pupil plane of an illumination system that irradiates an energy beam on the pattern.

14. The substrate processing method of claim 1 wherein, the exposure condition includes at least a spectral characteristic of an energy beam irradiated on the resist during the exposure.

15. The substrate processing method of claim 14 wherein, the spectral characteristic includes at least one of a first spectral width, the first spectral width being decided based on an integration value of an intensity distribution of a spectral of the energy beam, and a second spectral width, the second spectral width being a width when an intensity of the spectral of the energy beam decreases to a predetermined rate with respect to a peak value of the intensity of the spectral of the energy beam.

16. The substrate processing method of claim 1 wherein, when an isolated pattern and a dense pattern are transferred onto a resist in one exposure in the patterning of the resist, the exposure condition is adjusted to make a line width of a resist pattern and a linewidth of a pattern after etching be in a desired relation in both the isolated pattern and the dense pattern.

17. A device manufacturing method that comprises a lithography process in which a pattern is formed on a substrate using the substrate processing method of claim 1.

18. The device manufacturing method of claim 17 wherein, the lithography process comprises a substrate processing process in which at least one of a wiring pattern and a gate pattern of a transistor is formed.

19. A manufacturing method of a photomask used in a patterning process of a resist on a substrate by exposure, the method comprising:
predicting a device linewidth characteristic based on a sharp-edged feature of a projected image of a pattern that is to be formed on the photomask;
wherein the sharp-edged feature is a feature that shows a change in a projected image linewidth with respect to a change in a slice level, the projected image linewidth being a distance between two intersecting points of the projected image and the slice level;
changing a linewidth in at least a part of the pattern based on the device linewidth characteristic that has been predicted;
forming a pattern whose linewidth in at least a part of the pattern has been changed; and
patterning the resist on a mask substrate based on the pattern.

20. The manufacturing method of a photomask of claim 19 wherein,
the sharp-edged feature is a differential value at an intersection position with a level corresponding to a resist sensitivity in an image intensity distribution of the projected image.

21. The manufacturing method of a photomask of claim 19 wherein,
the sharp-edged feature is a log slope at an intersection position with a level corresponding to a resist sensitivity in an image intensity distribution of the projected image.

22. The manufacturing method of a photomask of claim 19 wherein,
the sharp-edged feature is a contrast of the projected image.

23. The manufacturing method of a photomask of claim 19 wherein,
in the predicting the device linewidth characteristic, a profile of a resist pattern that can be obtained through the patterning process and a development process is used.

24. The manufacturing method of a photomask of claim 19 wherein,
in the predicting the device linewidth characteristic, a profile of a resist pattern is predicted based on the sharp-edged feature of a projected image, whereby
the device linewidth characteristic is predicted based on the profile of the resist pattern that has been predicted.

25. The manufacturing method of a photomask of claim 24 wherein,
the profile of the resist pattern is predicted taking into consideration a deformation of the resist pattern due to a heating treatment.

26. The manufacturing method of a photomask of claim 19, the method further comprising:
a developing process and an etching process after the patterning of the resist, wherein
in the predicting the device linewidth characteristic, the device linewidth characteristic is predicted based ont eh sharp-edged feature of the projected image of the predetermined pattern and an etching characteristic in the etching process.

27. A photomask used in a patterning process of a resist on a substrate by exposure, on which a pattern is formed using the manufacturing method of claim 19.

28. A device manufacturing method that comprises a lithography process in which a pattern is formed on a substrate using a photomask of claim 27.

29. The device manufacturing method of claim 28 wherein,
the lithography process comprises a substrate processing process in which at least one of a wiring pattern and a gate pattern of a transistor is formed.

* * * * *